(12) United States Patent
Chan

(10) Patent No.: US 6,407,582 B1
(45) Date of Patent: Jun. 18, 2002

(54) ENHANCED 2.5V LVDS DRIVER WITH 1.8V TECHNOLOGY FOR 1.25 GHZ PERFORMANCE

(75) Inventor: Francis Chan, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/805,809

(22) Filed: Mar. 13, 2001

(51) Int. Cl.$^7$ .................. H03K 19/0175; H03K 19/20

(52) U.S. Cl. ............................. 326/86; 326/112

(58) Field of Search .................. 326/86, 87, 80–83, 326/17, 112, 119, 121

(56) References Cited

U.S. PATENT DOCUMENTS

| | | | |
|---|---|---|---|
| 4,709,162 A | 11/1987 | Braceras et al. | |
| 4,779,270 A | 10/1988 | Gruodis et al. | |
| 5,274,284 A | 12/1993 | Krenik et al. | |
| 5,365,126 A | 11/1994 | Krenik et al. | |
| 5,465,058 A | 11/1995 | Krenik et al. | |
| 5,831,449 A | * 11/1998 | Shigehara et al. | 326/81 |
| 5,977,807 A | * 11/1999 | Watanabe | 327/175 |
| 6,060,905 A | 5/2000 | Bickford et al. | |
| 6,147,511 A | * 11/2000 | Patel et al. | 326/81 |

FOREIGN PATENT DOCUMENTS

JP      408335126 A   * 12/1996

* cited by examiner

Primary Examiner—Michael Tokar
Assistant Examiner—James H Cho
(74) Attorney, Agent, or Firm—Whitham, Curtis & Christofferson, P.C.; Richard A. Henkler

(57) ABSTRACT

An enhanced 2.5V LVDS driver with 1.8V technology for 1.25 GHz provides high speed performance for off chip drivers. Level shifting is accomplished in predriver circuits with buffer amplifier circuits operating at the on chip operating voltage level driving differential amplifiers operating at the higher driver circuit operating voltage level. An enhancement circuit is interposed between the level shifting circuits and the output stage, and this enhancement circuit speeds up the switching times of the signals input to the output stage. The enhancement circuit comprises first and second complementary transistors connected in cascode between the higher driver circuit operating voltage and a third transistor connected between the node of a predriver circuit and the higher supply voltage. The gate of the third transistor is connected to a common node between the first and second transistors. A rising signal from the predriver circuit turns the first transistor on causing the third transistor to turn on, pulling the output of the predriver circuit rapidly to the supply voltage. A circuit responsive to the input signal turns off the second transistor preventing current feed through the first and second transistors.

8 Claims, 6 Drawing Sheets

ENHANCED 2.5V LVDS DRIVER WITH 1.8V TECHNOLOGY FOR 1.25 GHZ PERFORMANCE

BACKGROUND OF THE INVENTION

1. Field of the Invention

The present invention generally relates to off chip driver circuits and, more particularly, to an enhanced 2.5V LVDS driver with 1.8V technology for 1.25 GHz performance.

2. Background Description

High speed digital circuits having operating frequencies above one GigaHertz (GHz) typically operate at relatively lower supply voltage levels than circuits off the chip on which those circuits are implemented. This requires level shifting of the operating voltage to provide the required driver voltages for off chip circuits. However, the higher voltage output circuits typically do not switch at the higher frequencies of the on chip circuits. This presents a problem in realizing the high speed operation of the circuit in off chip circuits.

SUMMARY OF THE INVENTION

It is therefore an object of the present invention to provide circuitry which provides both level shifting of the operating voltage levels from on chip circuitry to off chip drivers while at the same time realizing the high speed performance of the on chip circuitry in the output drivers.

According to the invention, level shifting is accomplished in predriver circuits with buffer amplifier circuits operating at the on chip operating voltage level driving differential amplifiers operating at the higher driver circuit operating voltage level. An enhancement circuit is interposed between the level shifting circuits and the output stage, and this enhancement circuit speeds up the switching times of the signals input to the output stage. The enhancement circuit comprises first and second complementary transistors connected in cascode between the higher driver circuit operating voltage and a third transistor connected between the node of a predriver circuit and the higher supply voltage. The gate of the third transistor is connected to a common node between the first and second transistors. A rising signal from the predriver circuit turns the first transistor on causing the third transistor to turn on, pulling the output of the predriver circuit rapidly to the supply voltage. A circuit responsive to the input signal turns off the second transistor preventing current feed through the first and second transistors.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
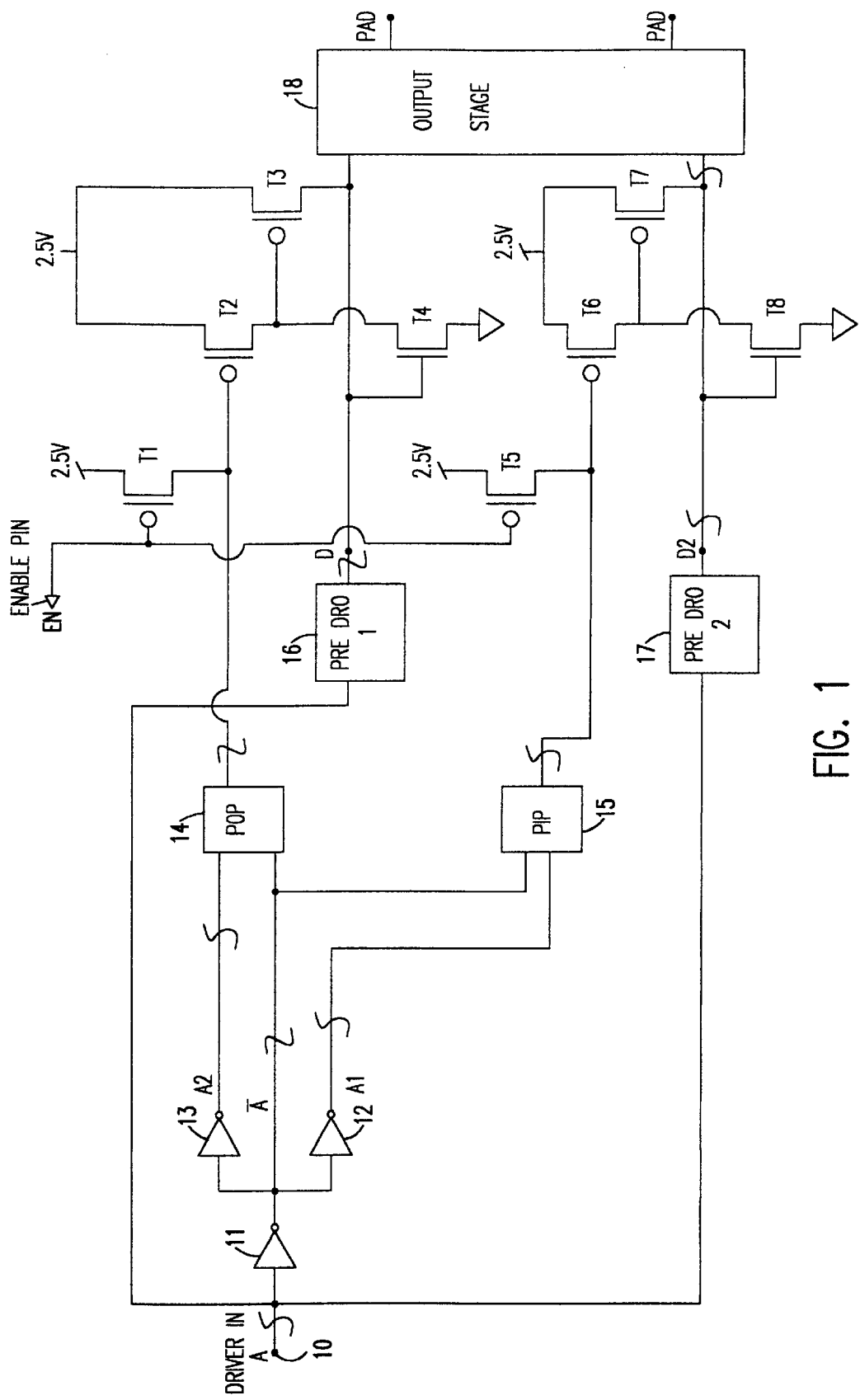
FIG. 1 is a block and schematic diagram showing the enhanced driver according to the invention.

Referring now to the drawings, and more particularly to FIG. 1, there is shown the enhanced LVDS driver with 1.8V technology for 1.25 GHz performance. The driver input signal A at terminal 10 is first input to inverter 11, the output of which is signal $\overline{A}$, the complement of the signal A. This output is input to two additional inverters 12 and 13, the outputs of which are, respectively, signals A1 and A2. Thus, for a rising pulse input signal A, signal $\overline{A}$ is a falling pulse and both signals A1 and A2 are rising pulses. Signal $\overline{A}$ is input to circuits 14 and 15 designated as POP and PIP, respectively. Circuit 14 also receives as an input signal A2, while circuit 15 also receives as an input signal A1.

The input signal A is also supplied to each of two predriver circuits 16 and 17, identified as Predrive1 and Predrive2, respectively. The outputs of circuits 16 and 17, signals D and D2, respectively, are input to output stage 18, which generates the off chip output signals PAD and its complement $\overline{PAD}$. The output signals of the circuits 14 and 15, POP and PIP, are input to an enhancement circuit comprising complementary metal oxide silicon (CMOS) field effect transistors (FET) T1 to T8. More specifically, the output of circuit 14 is connected directly to the gate of p-type FET T2, and the output of circuit 15 is connected to the gate of p-type FET T6. An p-type FET T1 is connected between a 2.5V source and the gate of T2, while an p-type FET T5 is connected between the 2.5V source and the gate of T6. The gates of T1 and T5 are connected in common to an enable pin. In other words, the enhanced driver functions as a tri-state driver. Continuing, T2 has its drain connected to the 2.5V source and its source connected to the source of n-type FET T4. The drain of T4 is connected to ground, and its gate is connected to the output of Predrive1 circuit 16. An p-type FET T3 is connected between the 2.5V source and the output signal D of Predrive1 circuit 16, and the gate of T3 is connected to the commonly connected sources of T2 and T4. Similarly, T6 has its drain connected to the 2.5V source and its source connected to the source of p-type FET T8. The drain of T8 is connected to ground, and its gate is connected to the output signal D2 of Predrive2 circuit 17. An n-type FET T7 is connected between the 2.5V source and the output of Predrive2 circuit 17, and the gate of T7 is connected to the commonly connected sources of T6 and T8.

In operation, when the input signal A starts to switch from a "0" to a "1", the output signal D of Predrive1 circuit 14 will start to switch from a "1" to a "0" and the output signal D2 of Predrive2 circuit 15 will switch from a "0" to a "1". In order to achieve a very high frequency operation, the rising transition of output signal D2 needs to be able to reach a high enough level fast enough to provide sufficient drive strength to the output stage 18. This is accomplished by turning on T8 (at node D2), which pulls the gate of 17 down, thus turning on T7 and pulling up node D2 to 2.5V as quickly as possible. T6 is initially on, but as soon as the rising output of PIP arrives, T6 turns off, thus preventing any feed through current through T6 and T8. T5 is used to disable the device during tristate operation. A similar analysis may be applied to T2, T3 and T4 when the input signal A starts to switch from a "1" to a "0", the output signal D2 of Predrive2 circuit 15 will start to switch from a "1" to a "0" and the output signal D of Predrive1 circuit 14 will switch from a "0" to a "1". If the signal is coming down from "1" to a "0" at node D, T2, T3 and T4 bear no advantage. This is also true for node D2 where T6, T7 and T8 bear no advantage when D2 is switching from "1" to a "0". POP and PIP simply provide proper arrival timing to shut off T2 and T6 to prevent feed through current from 16 to T8 or T2 to T4.

Figure 2:
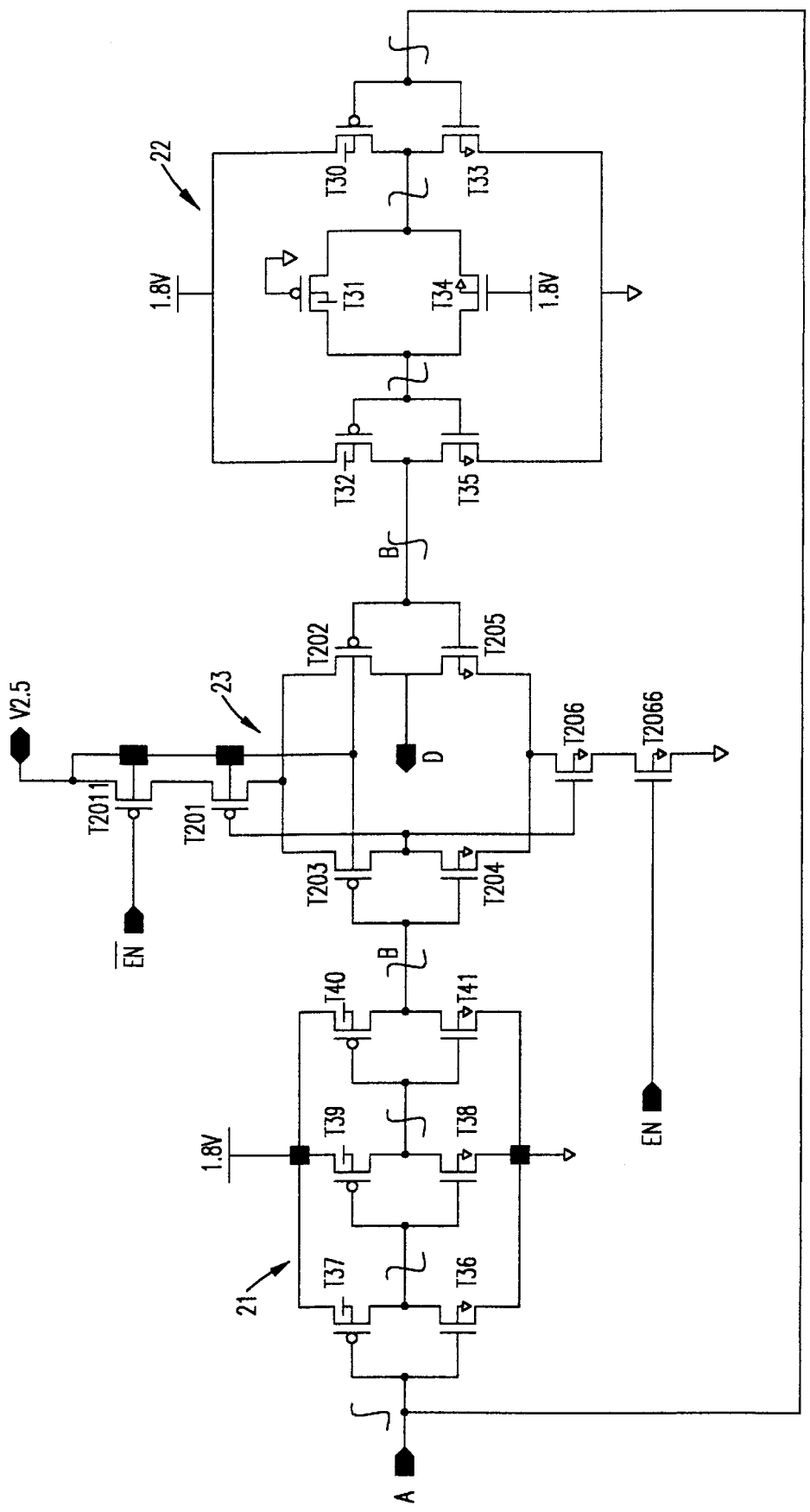
FIG. 2 is a schematic diagram of the Predriver1 circuit in FIG. 1.

Predrive1 circuit 16 is shown in FIG. 2. This circuit comprises two buffer amplifiers 21 and 22, each of which receives the input signal A. These two buffer amplifiers, in turn, drive a differential amplifier circuit 23. The level shift of operating voltage from 0V to 1.8V rail-to-rail to an operating voltage from 0V to 2.5V rail-to-rail is accomplished by differential amplifier 23. Considering first buffer amplifier 21, this amplifier is composed of three cascaded inverters comprised of complementary transistor pairs T36 and T37, T38 and T39, and T41 and T42. These three inverters are connected between a source of 1.8V supply voltage and ground. The output signal B is the complement of input signal A. The buffer amplifier 22, on the other hand, is composed of two inverters and a pass gate between the two inverters. The input inverter is comprised of complementary transistors T30 and T33. This is followed by a pass gate comprised of complementary transistors T31 and T34. The gate of p-type FET T34 is connected to the 1.8V supply voltage, and the gate of n-type FET T31 is connected to ground. The output inverter is comprised of complementary transistors T32 and T35. The input and output inverters are connected between the 1.8V supply voltage and ground. The output signal $\overline{B}$ follows the input signal A.

Turning next to the differential amplifier 23, the signal B is input to a first complementary pair of transistors T203 and T204. The signal $\overline{B}$ is input to a second complementary pair of transistors T202 and T205. The drains of p-type FETs T203 and T202 are connected in common to the 2.5V supply voltage via a cascode pair of p-type FETs T201 and T2011. The drains of n-type FETs T204 and T205 are connected in common to ground via a cascode pair of n-type FETs T206 and T2066. The commonly connected sources of T203 and T204 are connected to the gates of T201 and T206. An enable signal, EN, is connected to the gate of T2066, while the complement of the enable signal, $\overline{EN}$ is connected to the gate of T2011. Again, this signal is used for the tri-state operation of the driver circuit. In normal operation, EN=1 and $\overline{EN}$=0. Finally, the commonly connected sources of T202 and T205 provide the output signal D1.

Figure 3:
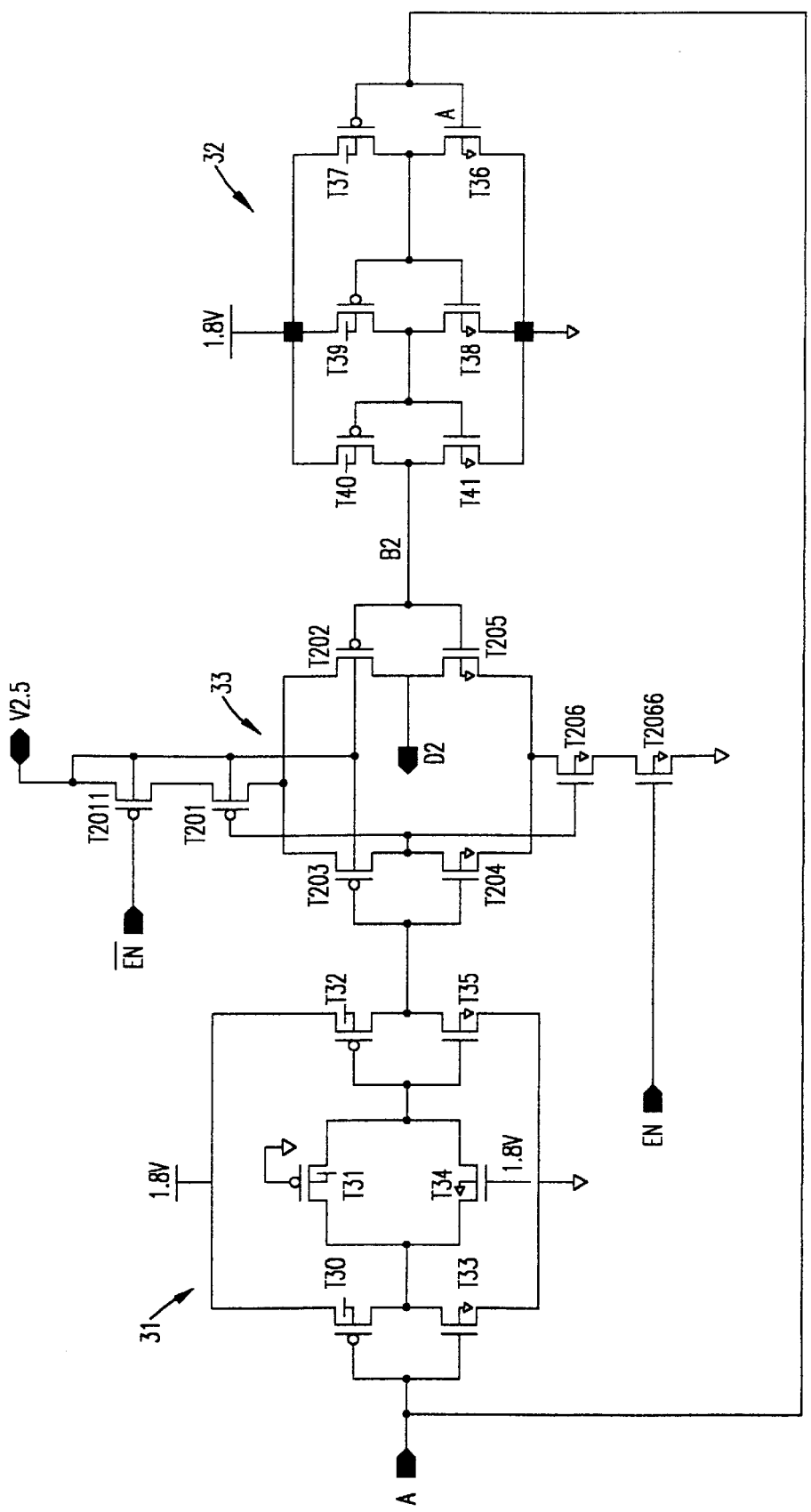
FIG. 3 is a schematic diagram of the Predriver2 circuit in FIG. 1.

Referring next to FIG. 3, there is shown the Predrive2 circuit 17. This circuit is very similar to that of the Predrive1 circuit 16 shown in FIG. 2. The circuit comprises two buffer amplifier circuits 31 and 32, each of which receives the input signal A. These two buffer amplifiers, in turn, drive a differential amplifier circuit 33. The differential amplifier 33 provides the level shift from operating voltage from 0V to 1.8V rail-to-rail to operating voltage from 0V to 2.5V rail-to-rail. The difference between the Predrive2 circuit 17 and the Predrive1 circuit 16 is that the output signals are complementary to one another. In the Predrive2 circuit 17 shown in FIG. 3, the buffer amplifier 31 is composed of two inverters and a pass gate between the two inverters, so the output of the amplifier 31, signal $\overline{B2}$ follows the input signal A, while the buffer amplifier 32 is composed of three inverters, so the output of the amplifier 32, signal B2 is the complement of signal $\overline{B2}$. Similarly, the output signal D2 of the differential amplifier 33 is the complement of output signal D, the output of differential amplifier 23 in FIG. 2.

Figure 4:
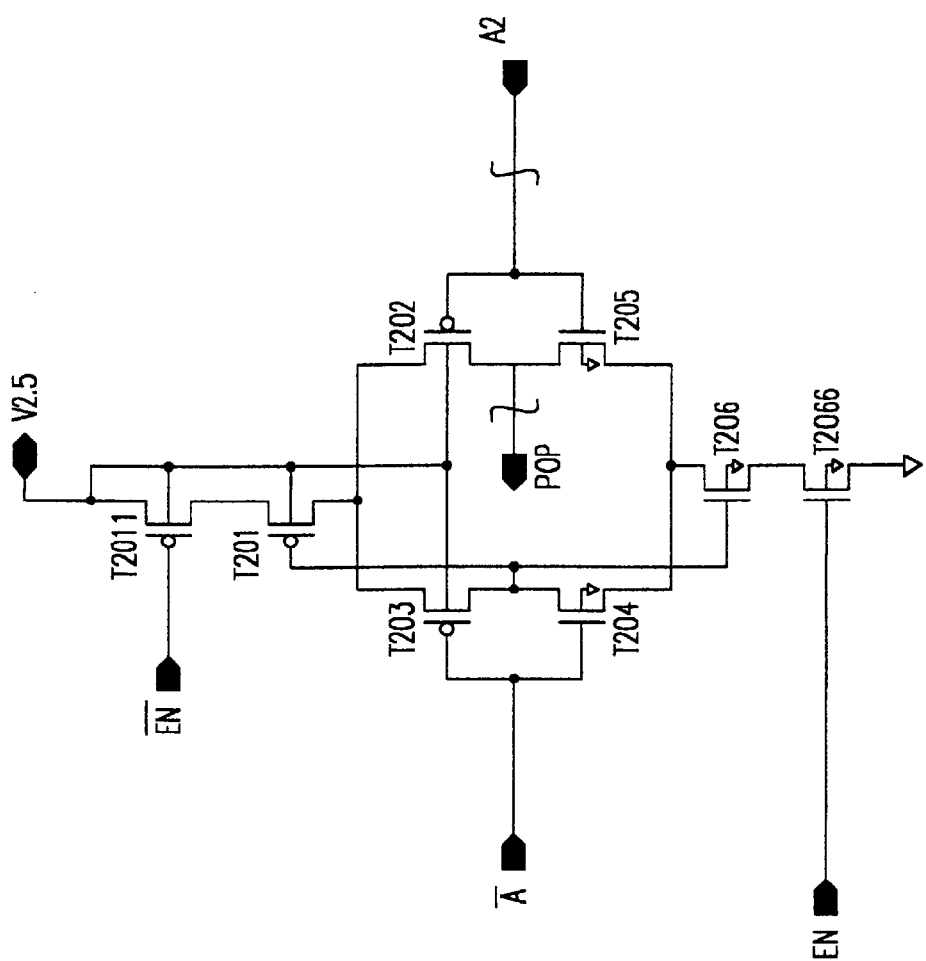
FIG. 4 is a schematic diagram of the POP circuit in FIG. 1.

Turning next to FIG. 4, there is shown the POP circuit 14. This is a differential amplifier circuit which receives as inputs signals A2 and $\overline{A}$ The differential amplifier is identical with the differential amplifiers 23 and 33 in FIGS. 2 and 3, respectively. Like those differential amplifiers, this differential amplifier also provides a level shift in operating voltage from 0V to 1.8V rail-to-rail to the operating voltage from 0V to 2.5V rail-to-rail. The output is the signal POP which rises as signal A2 falls.

Figure 5:
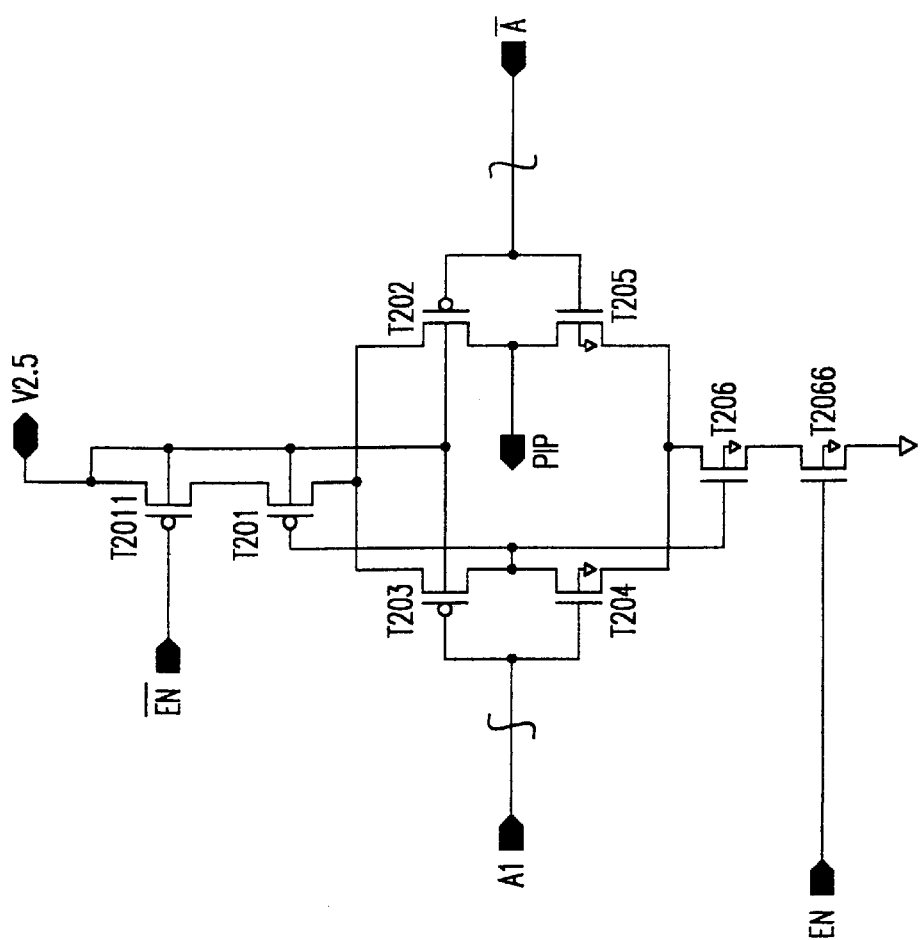
FIG. 5 is a schematic diagram of the PIP circuit in FIG. 1.

FIG. 5 shows the PIP circuit 15. This again is a differential amplifier circuit identical with the differential amplifiers 23 and 33. The PIP circuit 15 receives as inputs signals A1 and $\overline{A}$ and generates the signal PIP which follows the signal A1.

Figure 6:
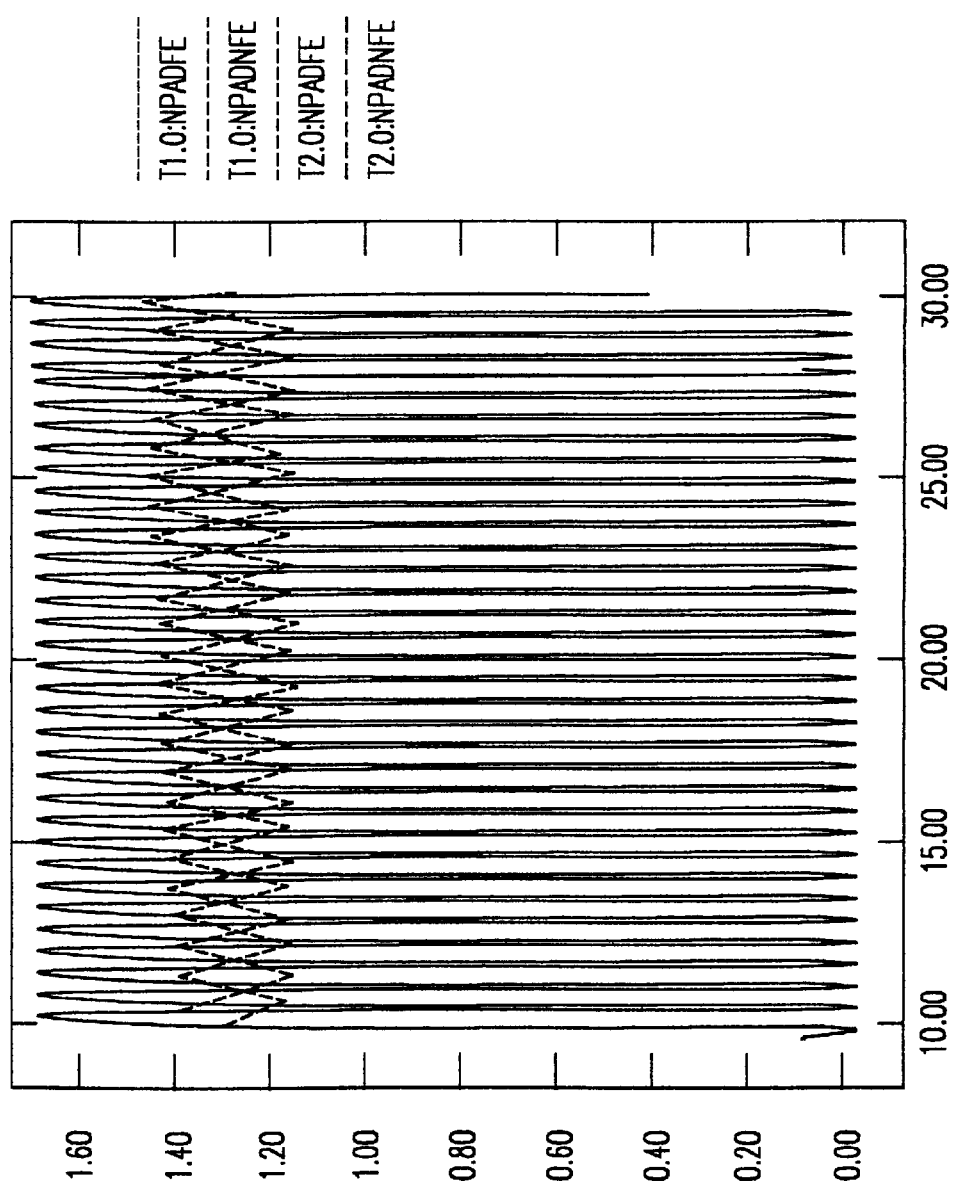
FIG. 6 is a graph showing the far end waveforms at 1.25 GHz with and without the enhancement scheme of the present invention.

FIG. 6 shows the far end waveforms at 1.25 GHz with and without the enhancement scheme of the present invention. The dotted lines (T1.0:NPADFE and T1.0:NPADNFE) represent the differential output swing of the driver without enhancement at the far end of the transmission line. At 1.25 GHz, the common mode of the differential swing (the point where PADFE and PADNFE cross) appears to be unstable over time at such a high frequency. In contrast, the dashed lines (T2.0:NPADFE and T2.0:NPADNFE) represent the differential output swing of the driver with enhancement, showing a much more stable common mode of operation.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. An enhanced off-chip driver providing high speed output with voltage level shift comprising:

a predriver circuit performing level shifting of an on chip generated signal from a lower supply voltage level to a higher supply voltage level;

an enhancement circuit interposed between the predriver circuit and an output stage, the enhancement circuit speeding up switching times of the signals input to the output stage, the enhancement circuit comprising first and second complementary transistors connected in cascode between the higher supply voltage level and ground and a third transistor connected between an output node of the predriver circuit and the higher supply voltage level, a gate of the first transistor being connected to said output node and a gate of the third transistor being connected to a common node between the first and second complementary transistors so that a rising signal from the predriver circuit turns the first transistor on causing the third transistor to turn on, pulling the output of the predriver circuit rapidly to the higher supply voltage level; and means responsive to the rising input signal to turn off the second transistor preventing current feed through the first and second complementary transistors.

2. The enhanced off-chip driver recited in claim 1, wherein the predriver circuit comprises a pair of buffer amplifier circuits operating at the lower supply voltage level and driving a differential amplifier and the level shifting in the predriver circuit is accomplished by the differential amplifier circuit operating at the higher supply voltage level.

3. The enhanced off-chip driver recited in claim 2, wherein the means responsive to the rising input signal to turn off the second transistor comprises a second differential amplifier circuit receiving a complement of the on chip generated signal and an inverted signal of said complement, said second differential amplifier circuit operating at the higher supply voltage level and performing a level shift.

4. The enhanced off-chip driver recited in claim 2, wherein a first buffer amplifier of the pair of buffer amplifier circuits comprises three inverters connected in cascade and a second buffer amplifier of the pair of buffer amplifier circuits comprises two inverters with a pass gate between the two inverters.

5. An enhanced off-chip driver providing high speed output with voltage level shift comprising:

first and second predriver circuits performing level shifting of an on chip generated signal from a lower supply voltage level to a higher supply voltage level;

first and second enhancement circuits respectively interposed between the first and second predriver circuits and an output stage, the first and second enhancement circuits speeding up switching times of the signals input to the output stage, the first enhancement circuit comprising first and second complementary transistors connected in cascode between the higher supply voltage level and ground and a third transistor connected between a first output node of the first predriver circuit and the higher supply voltage level, a gate of the first transistor being connected to said first output node and a gate of the third transistor being connected to a common node between the first and second complementary transistors so that a rising signal from the first predriver circuit turns the first transistor on causing the third transistor to turn on, pulling the output of the first predriver circuit rapidly to the higher supply voltage level, the second enhancement circuit comprising fourth and fifth complementary transistors connected in cascode between the higher supply voltage level and ground and a sixth transistor connected between a second output node of the second predriver circuit and the higher supply voltage level, a gate of the fourth transistor being connected to said second output node and a gate of the sixth transistor being connected to a common node between the fourth and fifth complementary transistors so that a rising signal from the second predriver circuit turns the fourth transistor on causing the sixth transistor to turn on, pulling the output of the second predriver circuit rapidly to the higher supply voltage level; and first and second means respectively responsive to a rising or falling input signal to turn off the second or fifth transistor preventing current feed through the first and second complementary transistors or fourth and fifth complementary transistors.

6. The enhanced off-chip driver recited in claim 5, wherein the first and second predriver circuits each comprise a pair of buffer amplifier circuits operating at the lower supply voltage level and driving a differential amplifier and the level shifting in the predriver circuit is accomplished by the differential amplifier circuit operating at the higher supply voltage level.

7. The enhanced off-chip driver recited in claim 6, wherein the first and second means responsive to the rising input signal to turn off the second and fifth complementary transistors, respectively, comprise third and fourth differential amplifier circuits respectively receiving a complement of the on chip generated signal and first and second inverted signals of said complement, said third and fourth differential amplifier circuits operating at the higher supply voltage level and performing a level shift.

8. The enhanced off-chip driver recited in claim 5, wherein a first buffer amplifier of a pair of buffer amplifier circuits of the first predriver circuit comprises three inverters connected in cascade and a second buffer amplifier of the pair of buffer amplifier circuits of the first predriver circuit comprises two inverters with a pass gate between the two inverters, and wherein a third buffer amplifier of the pair of buffer amplifier circuits of the second predriver circuit comprises two inverters with a pass gate between the two inverters and a fourth buffer amplifier of the pair of buffer amplifier circuits of the second predriver circuit comprises three inverters connected in cascade.

* * * * *